US011374138B2

(12) United States Patent
Moriwaki

(10) Patent No.: US 11,374,138 B2
(45) Date of Patent: Jun. 28, 2022

(54) IMAGING ELEMENT, SOLID STATE IMAGING DEVICE, AND ELECTRONIC DEVICE HAVING AN AMORPHOUS OXIDE ELECTRODE COMPRISING TUNGSTEN

(71) Applicant: SONY CORPORATION, Tokyo (JP)

(72) Inventor: Toshiki Moriwaki, Kanagawa (JP)

(73) Assignee: SONY CORPORATION, Tokyo (JP)

(*) Notice: Subject to any disclaimer, the term of this patent is extended or adjusted under 35 U.S.C. 154(b) by 621 days.

(21) Appl. No.: 16/061,456

(22) PCT Filed: Nov. 30, 2016

(86) PCT No.: PCT/JP2016/085554
§ 371 (c)(1),
(2) Date: Jun. 12, 2018

(87) PCT Pub. No.: WO2017/110392
PCT Pub. Date: Jun. 29, 2017

(65) Prior Publication Data
US 2020/0266309 A1 Aug. 20, 2020

(30) Foreign Application Priority Data

Dec. 21, 2015 (JP) .............................. JP2015-248139
Mar. 9, 2016 (JP) .............................. JP2016-045277
Sep. 7, 2016 (JP) .............................. JP2016-174522

(51) Int. Cl.
*H01L 31/0224* (2006.01)
*H01L 33/42* (2010.01)
(Continued)

(52) U.S. Cl.
CPC .... *H01L 31/022483* (2013.01); *H01L 27/307* (2013.01); *H01L 31/022466* (2013.01);
(Continued)

(58) Field of Classification Search
CPC ..... H01L 31/022483; H01L 31/022466; H01L 54/442; H01L 2251/305
See application file for complete search history.

(56) References Cited

U.S. PATENT DOCUMENTS 5,216,274 A * 6/1993 Mihara ............. H01L 27/14665
257/435
2009/0026382 A1* 1/2009 Sakamoto ............... G01T 1/246
250/370.09
(Continued)

FOREIGN PATENT DOCUMENTS

JP 2012/160619 8/2012
WO WO 2008/154128 12/2008

OTHER PUBLICATIONS

R.K. Gupta, et al., "Thickness dependence of optoelectrical properties of tungsten-doped indium oxide films," 2009, Applied Surface Science 255, pp. 8926-8930 (Year: 2009).*
(Continued)

Primary Examiner — Kevin Parendo
(74) Attorney, Agent, or Firm — Sheridan Ross P.C.

(57) ABSTRACT

There is provided imaging devices and methods of forming the same, including a stacked structure body including a first electrode, a light-receiving layer formed on the first electrode, and a second electrode formed on the light-receiving layer, where the second electrode comprises an amorphous oxide comprising at least one of zinc and tungsten, and where the second electrode is transparent and electrically conductive and has absorption characteristics of 20% or more at a wavelength of 300 nm.

27 Claims, 4 Drawing Sheets

(51) Int. Cl.
*H01L 27/30* (2006.01)
*H01L 51/44* (2006.01)

(52) U.S. Cl.
CPC ............ *H01L 33/42* (2013.01); *H01L 51/442* (2013.01); *H01L 2251/305* (2013.01)

(56) References Cited

U.S. PATENT DOCUMENTS

| | | |
|---|---|---|
| 2009/0127519 A1 | 5/2009 | Abe et al. |
| 2011/0049492 A1* | 3/2011 | Sawaki .................. B82Y 10/00 257/40 |
| 2012/0074513 A1* | 3/2012 | Mitsui ................... H01L 51/442 257/431 |
| 2012/0205698 A1* | 8/2012 | Yamazaki ............... H01L 51/56 257/98 |
| 2014/0179055 A1* | 6/2014 | Suzuki .................. C09B 57/008 438/93 |
| 2014/0306180 A1 | 10/2014 | Moriwaki et al. |
| 2015/0060839 A1 | 3/2015 | Suzuki et al. |
| 2015/0318446 A1* | 11/2015 | Hu .......................... H01L 33/42 257/76 |
| 2017/0038651 A1* | 2/2017 | Takamaru ......... G02F 1/134363 |

OTHER PUBLICATIONS

Xifeng Li, et al., "Transparent conductive oxide thin films of tungsten-doped indium oxide", 2006, Thin Solid Films 515, pp. 2471-2474 (Year: 2006).*

International Search Report and Written Opinion prepared by the European Patent Office dated Feb. 9, 2017, for International Application No. PCT/JP2016/085554.

* cited by examiner

[Fig. 1A]
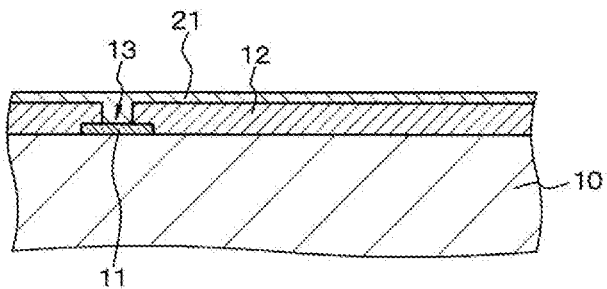
[Fig. 1B]
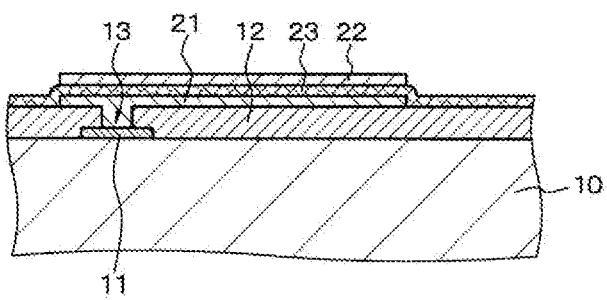
[Fig. 2]
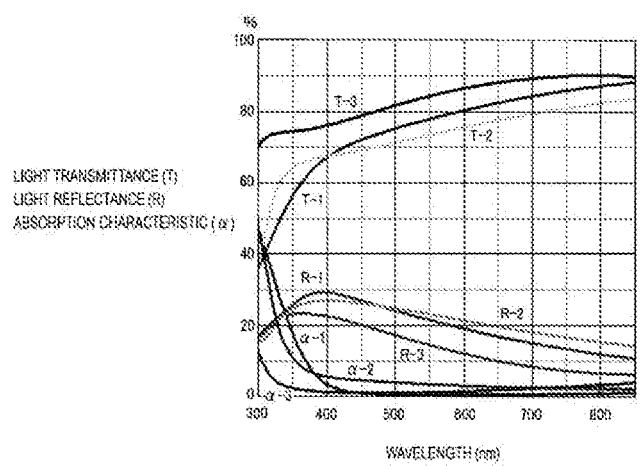

[Fig. 3]
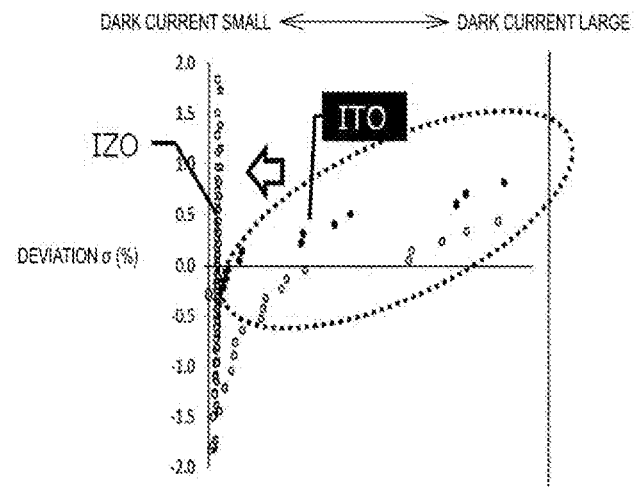
[Fig. 4A]
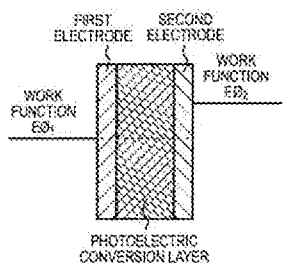
[Fig. 4B]
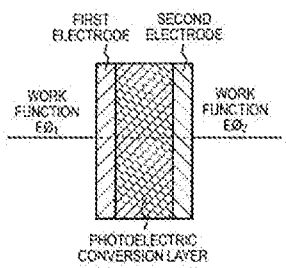
[Fig. 4C]
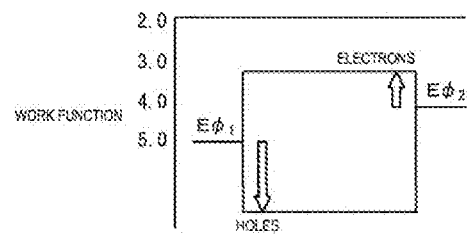

[Fig. 4D]
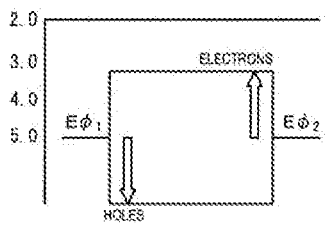
[Fig. 5A]
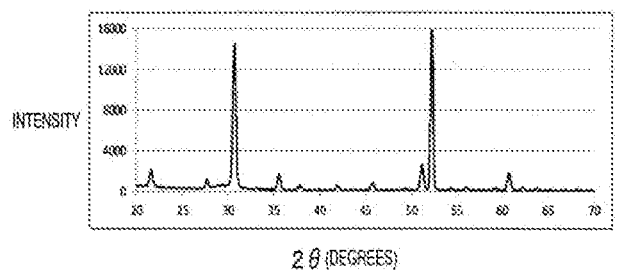
[Fig. 5B]
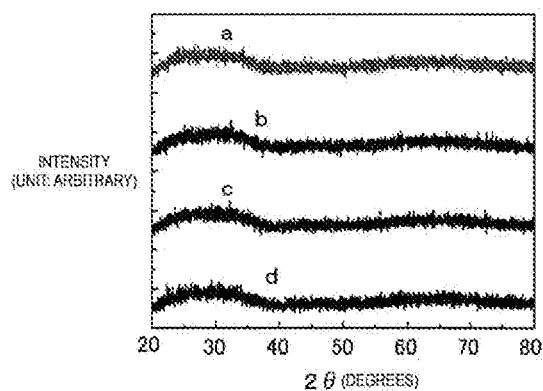
[Fig. 6]
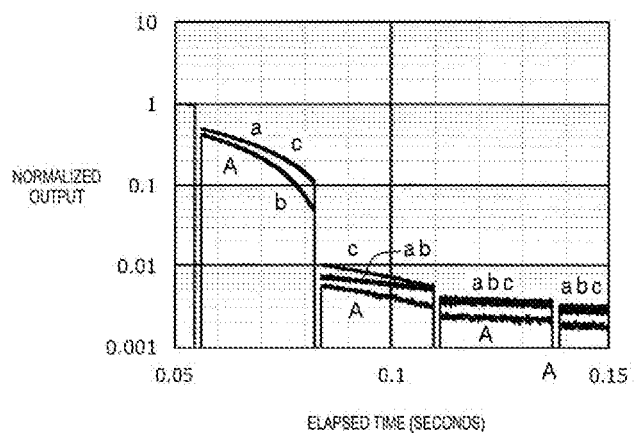

[Fig. 7]
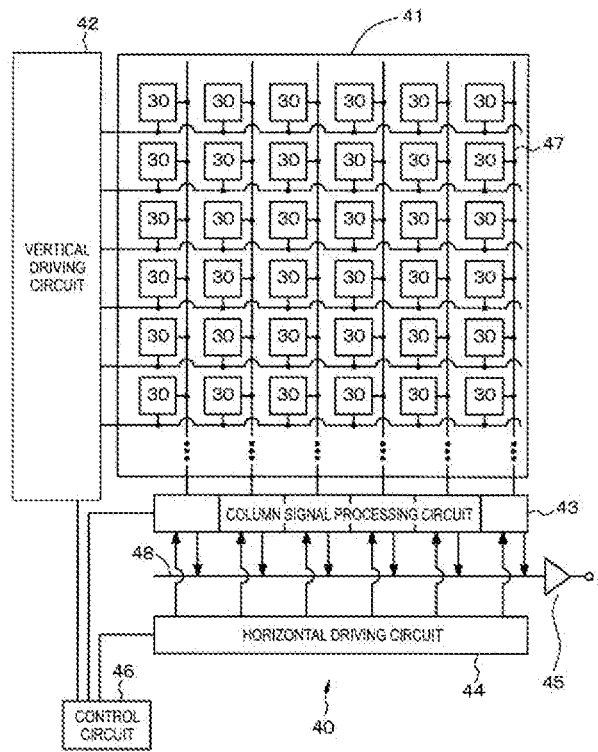
[Fig. 8]
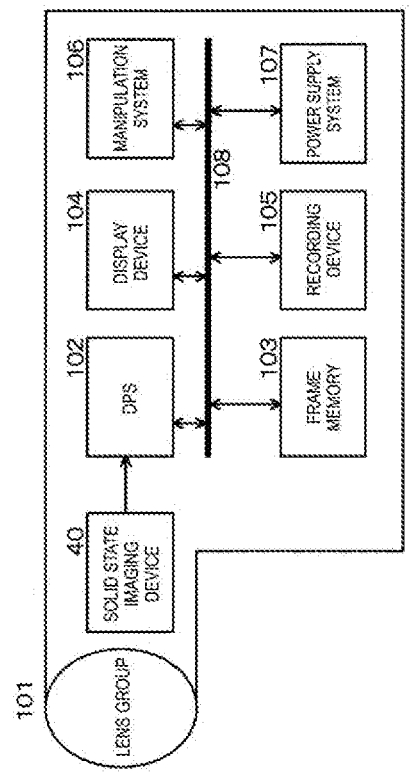

IMAGING ELEMENT, SOLID STATE IMAGING DEVICE, AND ELECTRONIC DEVICE HAVING AN AMORPHOUS OXIDE ELECTRODE COMPRISING TUNGSTEN

CROSS REFERENCE TO RELATED APPLICATIONS

This application is a national stage application under 35 U.S.C. 371 and claims the benefit of PCT Application No. PCT/JP2016/085554 having an international filing date of 30 Nov. 2016, which designated the United States, which PCT application claimed the benefit of Japanese Priority Patent Application JP 2016-045277 filed Mar. 9, 2016, Japanese Priority Patent Application JP 2015-248139 filed Dec. 21, 2015; and Japanese Priority Patent Application JP 2016-174522 filed Sep. 7, 2016, the entire contents of each of which are incorporated herein by reference.

TECHNICAL FIELD

The present disclosure relates to an imaging element, a solid state imaging device, and an electronic device.

BACKGROUND ART

An imaging element included in an image sensor or the like has a structure in which, for example, a light receiving layer (a photoelectric conversion layer) is sandwiched by two electrodes. In such an imaging element, the transparent electrode on which light is incident is usually formed of ITO having crystallinity. In regard to such a transparent electrode, the increase in dark current in the imaging element and the in-plane unevenness of dark current in the solid state imaging device are considered to be problems. In addition, there are also problems such as the worsening of afterimage characteristics. Various processes are executed during the manufacturing of the imaging element, and at this time ultraviolet light is often used. The ultraviolet light passes through the transparent electrode made of ITO and reaches the light receiving layer (the photoelectric conversion layer), and consequently the problems mentioned above arise. An imaging element (a photoelectric conversion element) for solving such problems is disclosed in JP 2012-160619A, for example. The imaging element includes a first light receiving unit formed on a substrate and having sensitivity to light of a first wavelength, a first ultraviolet absorbing unit that is formed on the first light receiving unit and absorbs ultraviolet light, a second light receiving unit formed on the first ultraviolet absorbing unit and having sensitivity to light of a second wavelength, a second ultraviolet absorbing unit that is formed on the second light receiving unit and absorbs ultraviolet light, and a third light receiving unit formed on the second ultraviolet absorbing unit and having sensitivity to light of a third wavelength.

CITATION LIST

Patent Literature

PTL 1: JP 2012-160619A

SUMMARY

Technical Problem

However, in the technology disclosed in the Japanese Unexamined Patent Application Publication mentioned above, since it is necessary to form the ultraviolet absorbing unit, the manufacturing process of the imaging element is unfortunately complicated and the manufacturing takes a long time. In addition, although an improvement in quantum efficiency is mentioned, an improvement in dark current is not mentioned at all, and an improvement in afterimage characteristics is not mentioned, either.

Thus, it is desirable to provide an imaging element and an electronic device having a configuration and a structure that, in spite of a simple structure, are less susceptible to the ultraviolet light used during the manufacturing process and a solid state imaging device including the imaging element.

Solution to Problem

According to various embodiments of the present disclosure, there is provided an imaging device, including: a stacked structure body including: a first electrode, a light-receiving layer formed on the first electrode, and a second electrode formed on the light-receiving layer, where the second electrode includes an amorphous oxide comprising at least one of zinc and tungsten, and where the second electrode is transparent and electrically conductive. In addition, the second electrode may have at least one of: absorption characteristics of 20% or more at a wavelength of 300 nm, and absorption characteristics of 10% or more at the wavelength of 350 nm. The second electrode may have a thickness that is about $3\times10^{-8}$ m to about $5\times10^{-8}$ m.

According to further various embodiments of the present disclosure, there is provided an imaging device, including: a plurality of imaging elements, where each of the imaging elements includes a stacked structure body including: a first electrode, a light-receiving layer formed on the first electrode, and a second electrode formed on the light-receiving layer, where the second electrode includes an amorphous oxide including at least one of zinc and tungsten, where the second electrode is transparent and electrically conductive. In addition, the second electrode may have at least one of: absorption characteristics of 20% or more at a wavelength of 300 nm, and absorption characteristics of 10% or more at the wavelength of 350 nm. The second electrode may have a thickness that is about $3\times10^{-8}$ m to about $5\times10^{-8}$ m.

According to still further various embodiments of the present disclosure, there is provided an electronic device including: a stacked structure body including a first electrode, a light-emitting/light-receiving layer formed on the first electrode, and a second electrode formed on the light-emitting/light-receiving layer, where the second electrode includes an amorphous oxide including at least one of zinc and tungsten, and where the second electrode is transparent and electrically conductive. In addition, the second electrode may have at least one of: absorption characteristics of 20% or more at a wavelength of 300 nm, and absorption characteristics of 10% or more at the wavelength of 350 nm. The second electrode may have a thickness that is about $3\times10^{-8}$ m to about $5\times10^{-8}$ m.

Advantageous Effects of Invention

In the imaging element, the electronic device, and the solid state imaging device according to embodiments of the present disclosure, since the second electrode is made of an amorphous oxide having transparency and electrical conductivity, light incident on the second electrode reaches the light receiving layer or the light emitting/light receiving layer (hereinafter, referred to as "a light receiving layer etc.") reliably, and holes or electrons generated in the light receiving layer etc. are reliably sent out to the outside via the second electrode. Furthermore, since the second electrode is formed of an amorphous oxide, damage due to stress is less likely to occur in the light receiving layer etc. In addition, since the second electrode is formed of an amorphous oxide containing zinc and/or tungsten, the second electrode absorbs ultraviolet light incident on the second electrode, and consequently the arrival of ultraviolet light at the light receiving layer etc. can be suppressed. The ultraviolet light is used in the patterning process of the second electrode, alternatively used at the time of forming various films and layers in the chemical vapor deposition method (the CVD method), or alternatively used at the time of forming on-chip microlenses, for example. In the imaging element, the electronic device, and the solid state imaging device according to the first embodiment of the present disclosure, since the ultraviolet absorption characteristic of the second electrode is prescribed, the arrival of ultraviolet light incident on the second electrode at the light receiving layer etc. can be suppressed still more reliably. Furthermore, in the imaging element, the electronic device, and the solid state imaging device according to the second embodiment of the present disclosure, since the thickness of the second electrode is prescribed, the light that has passed through the second electrode (the light except ultraviolet light) reaches the light receiving layer etc. still more reliably, and at the same time the second electrode can exhibit a function as an electrode reliably. The effects described in this specification are only examples and are not limitative ones, and there may be additional effects.

BRIEF DESCRIPTION OF DRAWINGS

FIG. 1A is a schematic partial cross-sectional view of a substrate etc. for describing a method for manufacturing an imaging element etc. of Example 1.

FIG. 1B is a schematic partial cross-sectional view of a substrate etc. for describing a method for manufacturing an imaging element etc. of Example 1.

FIG. 2 is a graph showing the relationships between the wavelength of incident light, and the absorption characteristic (a), the light transmittance, and the light reflectance in imaging elements etc. of Example 1 in which the second electrode is formed of an IZO and an IWO and an imaging element etc. of Comparative Example 1 in which the second electrode is formed of an ITO.

FIG. 3 is a graph showing the relationship between the dark current and the variation in dark current in an imaging element etc. of Example 1A in which the second electrode is formed of an IZO and an imaging element etc. of Comparative Example 1 in which the second electrode is formed of an ITO.

FIG. 4A is a conceptual diagram of the energy diagram in the imaging elements etc. of Example 1A.

FIG. 4B is a conceptual diagram of the energy diagram in the imaging elements etc. of Comparative Example 1.

FIG. 4C is a conceptual diagram showing the correlation between the difference in the value of work function and the energy diagram in the imaging elements etc. of Example 1A.

FIG. 4D is a conceptual diagram showing the correlation between the difference in the value of work function and the energy diagram in the imaging elements etc. of Comparative Example 1.

FIG. 5A is a chart showing the results of X-ray diffraction analysis of second electrodes in Comparative Example 1.

FIG. 5B is a chart showing the results of X-ray diffraction analysis of second electrodes in Example 1A.

FIG. 6 is a graph showing the afterimage characteristics in an imaging element of Example 1A in which the second electrode is formed of an IZO and imaging elements of Comparative Example 1 in which the second electrode is formed of an ITO.

FIG. 7 is a conceptual diagram of a solid state imaging device of Example 2.

FIG. 8 is a diagram showing the configuration of the solid state imaging device of Example 2.

DESCRIPTION OF EMBODIMENTS

Hereinbelow, embodiments of the present disclosure are described based on Examples with reference to the drawings; but the present disclosure is not limited to Examples, and the various numerical values and materials in Examples are only examples. The description is given in the following order: 1. an overall description of the imaging element, the solid state imaging device, and the electronic device according to the first embodiment and the second embodiment of the present disclosure; 2. Example 1 (the imaging element and the electronic device according to the first embodiment and the second embodiment of the present disclosure); 3. Example 2 (the solid state imaging device according to the first embodiment and the second embodiment of the present disclosure); and 4. other items.

<Overall Description of the Imaging Element, the Solid State Imaging Device, and the Electronic Device According to the First Embodiment and the Second Embodiment of the Present Disclosure>

The imaging element according to the first embodiment of the present disclosure, the imaging element in the solid state imaging device according to the first embodiment of the present disclosure, and the electronic device according to the first embodiment of the present disclosure may be hereinafter collectively referred to as "the imaging element etc. according to the first embodiment of the present disclosure," and the imaging element according to the second embodiment of the present disclosure, the imaging element in the solid state imaging device according to the second embodiment of the present disclosure, and the electronic device according to the second embodiment of the present disclosure may be hereinafter collectively referred to as "the imaging element etc. according to the second embodiment of the present disclosure."

In the imaging element etc. according to the first embodiment of the present disclosure, the thickness of the second electrode may be $1 \times 10^{-8}$ m to $1.5 \times 10^{-7}$ m, preferably $2 \times 10^{-8}$ m to $1 \times 10^{-7}$ m, and more preferably $3 \times 10^{-8}$ m to $5 \times 10^{-8}$ m. The second electrode preferably has absorption characteristics (ultraviolet absorption characteristics) of 10% or more, preferably 11% or more, and more preferably 12% or more at a wavelength of 350 nm, and 20% or more and preferably 35% or more at a wavelength of 300 nm. The second electrode may have one or more of the absorption characteristics.

In the imaging element etc. according to the first embodiment of the present disclosure or the imaging element etc. according to the second embodiment of the present disclosure including the preferred forms mentioned above, the work function of the second electrode may be 4.5 eV or less and preferably 4.1 eV to 4.5 eV. In these cases, it is preferable that the difference between the value of the work function of the second electrode and the value of the work function of the first electrode be 0.4 eV or more. By setting the difference between the value of the work function of the second electrode and the value of the work function of the first electrode to 0.4 eV or more, an internal electric field can be generated in the light receiving layer etc. on the basis of the difference in the value of work function, and an improvement in internal quantum efficiency can be achieved.

In the imaging element etc. according to the first embodiment of the present disclosure or the imaging element etc. according to the second embodiment of the present disclosure including the above preferred forms, the surface roughness Ra of the second electrode is preferably 1.5 nm or less, and the surface roughness Rq of the second electrode is preferably 2.5 nm or less. The surface roughnesses Ra and Rq are based on the provision of JIS B06 01-2013. The smoothness of the second electrode like this can suppress the surface scattering reflection at the second electrode, can reduce the surface reflection of light incident on the second electrode, can suppress the loss of the amount of light incident on the light receiving layer etc. via the second electrode, and can achieve an improvement in light current characteristics in photoelectric conversion.

Further, in the imaging element etc. according to the first embodiment of the present disclosure or the imaging element etc. according to the second embodiment of the present disclosure including the various preferred forms described above, it is preferable that the light transmittance of the second electrode for light of wavelengths of 400 nm to 660 nm be 65% or more. Also it is preferable that the light transmittance of the first electrode for light of wavelengths of 400 nm to 660 nm be 65% or more. Further, in the imaging element etc. according to the first embodiment of the present disclosure or the imaging element etc. according to the second embodiment of the present disclosure including the various preferred forms described above, it is preferable that the electric resistance value of the second electrode be $1 \times 10^{-6}$ Ω·cm or less. Alternatively, it is preferable that the sheet resistance value of the second electrode be $3 \times 10$Ω/☐ to $1 \times 10^3$Ω/☐.

In the imaging element etc. according to the first embodiment of the present disclosure or the imaging element etc. according to the second embodiment of the present disclosure including the various preferred forms described above (hereinafter, these may be collectively referred to as "the imaging element etc. of an embodiment of the present disclosure"), the stacked structure body is preferably in a form having an internal stress of compressive stress of 10 MPa to 50 MPa; thereby, during the formation of the second electrode, the occurrence of stress damage in the light receiving layer etc. can be suppressed still more reliably.

In the imaging element etc. of an embodiment of the present disclosure including the various preferred forms described above, a form in which, when the value of the dark current flowing between the first electrode and the second electrode when 0 volts is applied between the first electrode and the second electrode is denoted by $J_{d\text{-}0}$ (amperes) and the value of the dark current flowing between the first electrode and the second electrode when 5 volts is applied between the first electrode and the second electrode is denoted by $J_{d\text{-}5}$ (amperes), $J_{d\text{-}5}/J_{d\text{-}0} \leq 1.2$ is satisfied is possible. Further, when the value of the dark current flowing between the first electrode and the second electrode when a voltage more than 0 volts and not more than 5 volts is applied between the first electrode and the second electrode is denoted by $J_d$ (amperes), $J_d/J_{d\text{-}0} \leq 1.2$ is satisfied. Here, the dark current can be found by measuring the current flowing between the first electrode and the second electrode when a reverse bias voltage is applied between the first electrode and the second electrode in a state where light is not applied, specifically, in a state of a dark place.

In the imaging element etc. of an embodiment of the present disclosure, the second electrode is made of an amorphous oxide containing zinc and/or tungsten; as the material, specifically, a material in which zinc (Zn) is added to indium oxide (an indium-zinc oxide, an IZO), a material in which tungsten (W) is added to indium oxide (an indium-tungsten oxide, an IWO), and a material in which tungsten (W) and zinc (Zn) are added to indium oxide (an indium-tungsten-zinc oxide, an IWZO) may be given. In the IZO, assuming that the total amount of indium atoms and zinc atoms is 100 atomic %, the ratio of zinc atoms is preferably 5 atomic % to 20 atomic %. In the IWO, assuming that the total amount of indium atoms and tungsten atoms is 100 atomic %, the ratio of tungsten atoms is preferably 5 atomic % to 20 atomic %. In the IWZO, assuming that the total amount of indium atoms, tungsten atoms, and zinc atoms is 100 atomic %, the ratio of tungsten atoms is preferably 3 atomic % to 10 atomic %, and the ratio of zinc atoms is preferably 10 atomic % to 17 atomic %. However, the ratios are not limited to these values.

In the imaging element etc. of an embodiment of the present disclosure, the ultraviolet absorption characteristic of the second electrode can be controlled by controlling the amount of introduced oxygen gas (the partial pressure of oxygen gas) at the time of forming the second electrode based on the sputtering method. Specifically, it is preferable that the partial pressure of oxygen gas (=(the pressure of $O_2$ gas)/(the total pressure of Ar gas and $O_2$ gas)) during the formation based on the sputtering method be set to 0.005 to 0.01. Further, in the imaging element etc. of an embodiment of the present disclosure, a form in which, in the second electrode, the ratio of oxygen content is smaller than the ratio of oxygen content of a stoichiometric composition is possible. Here, the ultraviolet absorption characteristic of the second electrode can be controlled on the basis of the ratio of oxygen content; and as the ratio of oxygen content becomes smaller than the ratio of oxygen content of a stoichiometric composition, that is, the oxygen deficiency becomes larger, ultraviolet light is absorbed more.

The second electrode is formed based on the sputtering method; specifically, the magnetron sputtering method and the parallel plate sputtering method may be given, and a method using a plasma generation formation system using the DC discharge system or the RF discharge system may be given. An embodiment of the present disclosure has, as described above, a great feature in which the ultraviolet absorption characteristic of the second electrode can be controlled by the flow rate of oxygen (the amount of introduced oxygen gas or the partial pressure of oxygen gas).

By the electronic device according to the first embodiment or the second embodiment of the present disclosure, a light sensor or an image sensor can be formed. In this case, the light emitting/light receiving layer may be formed of, for example, an organic photoelectric conversion material.

In the imaging element etc. of an embodiment of the present disclosure, the reception or the emission/reception of light (more widely, electromagnetic waves, including visible light, ultraviolet light, and infrared light) in the light receiving layer etc. is performed via the second electrode.

Further, in the imaging element etc. of an embodiment of the present disclosure including these forms, a form in which the first electrode is formed of a transparent conductive material such as an indium-tin oxide (an ITO), an indium-zinc oxide (an IZO), or tin oxide ($SnO_2$) is possible. The value of the work function of the first electrode formed of any of these transparent conductive materials is, for example, 4.8 eV to 5.0 eV. As the method for forming the first electrode, depending on the material that forms the first electrode, PVD methods such as the vacuum deposition method, the reactive deposition method, various sputtering methods, the electron beam evaporation method, and the ion plating method, various CVD methods such as the pyrosol method, a method of pyrolyzing an organometallic compound, the spraying method, the dipping method, and the MOCVD method, the electroless plating method, and the electrolytic plating method may be given.

In the electronic device of an embodiment of the present disclosure including the various preferred forms and configurations described above, specifically for example, a configuration in which the first electrode is formed on a substrate, the light receiving layer etc. is formed on the first electrode, and the second electrode is formed on the light receiving layer etc. is possible. That is, the electronic device of an embodiment of the present disclosure has a two-terminal electronic device structure including the first electrode and the second electrode. However, the configuration is not limited to this, and a three-terminal electronic device structure further including a control electrode is possible, and thereby the current flowing can be modulated by applying a voltage to the control electrode. As the three-terminal electronic device structure, specifically, the same configuration and structure as a field effect transistor (FET) of what is called a bottom gate/bottom contact type, a bottom gate/top contact type, a top gate/bottom contact type, or a top gate/top contact type may be given. The second electrode may be made to function as a cathode electrode (negative electrode) (that is, made to function as an electrode for extracting electrons), and on the other hand the first electrode may be made to function as an anode electrode (positive electrode) (that is, made to function as an electrode for extracting holes). Also a structure in which a plurality of imaging elements or electronic devices including light receiving layers etc. having different light absorption spectra are stacked may be employed. Further, for example, a structure in which the substrate is formed of a silicon semiconductor substrate, a driving circuit, a light receiving layer, etc. of the imaging element or the electronic device are provided in the silicon semiconductor substrate, and imaging elements or electronic devices are stacked on the silicon semiconductor substrate may be employed.

The light receiving layer etc. may be in an amorphous state or a crystalline state. As the organic material that forms the light receiving layer etc. (organic photoelectric conversion material), an organic semiconductor material, an organometallic compound, and organic semiconductor fine particles may be given; or as the material that forms the light receiving layer etc., also a metal oxide semiconductor, inorganic semiconductor fine particles, a material in which a core member is coated with a shell member, and an organic-inorganic hybrid compound may be given.

Here, as the organic semiconductor material, specifically, an organic coloring agent typified by quinacridone and a derivative thereof, a coloring agent in which an ion of the earlier period (referring to the metals on the left side of the periodic table) is chelated with an organic material, typified by Alq3 (tris(8-quinolinolato)aluminum (III)), an organometallic dye complexed by a transition metal ion and an organic material, typified by zinc (II) phthalocyanine, dinaphthothienothiophene (DNTT), and the like may be given.

As the organometallic compound, specifically, the coloring agent in which an ion of the earlier period is chelated with an organic material and the organometallic dye complexed by a transition metal ion and an organic material described above may be given. As the organic semiconductor fine particles, specifically, associated bodies of the organic coloring agent typified by quinacridone and a derivative thereof described above, associated bodies of a coloring agent in which an ion of the earlier period is chelated with an organic material, associated bodies of an organometallic dye complexed by a transition metal ion and an organic material, or Prussian blue, in which metal ions are cross-linked by a cyano group, and a derivative thereof, or composite associated bodies of these may be given.

As the metal oxide semiconductor or the inorganic semiconductor fine particles, specifically, ITO, IGZO, ZnO, IZO, $IrO_2$, $TiO_2$, $SnO_2$, $SiO_X$, a metal chalcogenide semiconductor containing a chalcogen (e.g. sulfur (S), selenium (Se), or tellurium (Te)) (specifically, CdS, CdSe, ZnS, CdSe/CdS, CdSe/ZnS, or PbSe), ZnO, CdTe, GaAs, and Si may be given.

As the combination of the material in which a core member is coated with a shell member, that is, (core member, shell member), specifically, an organic material such as (polystyrene, polyaniline) and a metal material such as (a hardly ionizable metal material, an easily ionizable metal material) may be given. As the organic-inorganic hybrid compound, specifically, Prussian blue, in which metal ions are cross-linked by a cyano group, and a derivative thereof may be given, and in addition a coordination polymer, which is a general term of materials in which metal ions are infinitely cross-linked by a bipyridine and materials in which metal ions are cross-linked by a polyvalent ionic acid typified by oxalic acid and rubeanic acid, may be given.

As the method for forming the light receiving layer etc., depending on the material used, the application method, the physical vapor deposition method (the PVD method), and various chemical vapor deposition methods (CVD methods) including the MOCVD method may be given. Here, as the application method, specifically, the spin coating method; the immersion method; the casting method; various printing methods such as the screen printing method, the inkjet printing method, the offset printing method, and the gravure printing method; the stamping method; the spraying method; and various coating methods such as the air doctor coating method, the blade coating method, the rod coating method, the knife coating method, the squeeze coating method, the reverse roll coating method, the transfer roll coating method, the gravure coating method, the kiss coating method, the cast coating method, the spray coating method, the slit orifice coating method, and the calender coating method may be illustrated. In the application method, as the solvent, a non-polar or low-polar organic solvent such as toluene, chloroform, hexane, or ethanol may be illustrated. As the PVD method, various vacuum deposition methods such as the electron beam heating method, the resistance heating method, and flash evaporation; the plasma deposition method; various sputtering methods such as the dipole sputtering method, the direct current sputtering method, the direct current magnetron sputtering method, the radio-frequency sputtering method, the magnetron sputtering method, the ion beam sputtering method, and the bias sputtering method; and various ion plating methods such as the DC (direct current) method, the RF method, the multi-cathode method, the activated reaction method, the electric field deposition method, the radio-frequency ion plating method, and the reactive ion plating method may be given.

The thickness of the light receiving layer etc. is not limited, and $1 \times 10^{-10}$ m to $5 \times 10^{-7}$ m may be illustrated, for example.

As the substrate, an organic polymer such as polymethyl methacrylate (PMMA), polyvinyl alcohol (PVA), a polyvinyl phenol (PVP), a poly(ether sulfone) (PES), a polyimide, a polycarbonate (PC), polyethylene terephthalate (PET), and polyethylene naphthalate (PEN) (having a form of a polymer material such as a plastic film, a plastic sheet, or a plastic substrate formed of a polymer material and having flexibility) may be given. When a substrate formed of such a polymer material having flexibility is used, the electronic device can be incorporated into or integrated with an electronic apparatus having, for example, a curved surface shape. Alternatively, as the substrate, various glass substrates, various glass substrates with an insulating film formed on their surface, a quartz substrate, a quartz substrate with an insulating film formed on its surface, a silicon semiconductor substrate, a silicon semiconductor substrate with an insulating film formed on its surface, and metal substrates made of various alloys and/or various metals such as stainless steel may be given. As the insulating film, a silicon oxide-based material (e.g. $SiO_X$ or spin-on glass (SOG)); silicon nitride ($SiN_Y$); silicon oxynitride (SiON); aluminum oxide ($Al_2O_3$); and a metal oxide and a metal salt may be given. Also an electrically conductive substrate (a substrate made of a metal such as gold or aluminum or a substrate made of highly oriented graphite) with any of these insulating films formed on its surface may be used. The surface of the substrate is preferably smooth, but may have a roughness that does not adversely influence the characteristics of the light receiving layer etc. The adhesion between the first electrode and the substrate may be improved by forming a silanol derivative formed by the silane coupling method, forming a thin film made of a thiol derivative, a carboxylic acid derivative, a phosphoric acid derivative, or the like formed by the SAM method or the like, or forming a thin film made of an insulating metal salt or metal complex formed by the CVD method or the like, on the surface of the substrate.

The second electrode or the first electrode may be coated with a coating layer depending on the circumstances. As the material that forms the coating layer, a silicon oxide-based material; silicon nitride ($SiN_Y$); and an inorganic-based insulating material such as a metal oxide high dielectric insulating film of aluminum oxide ($Al_2O_3$) or the like may be given; further, polymethyl methacrylate (PMMA); a polyvinyl phenol (PVP); polyvinyl alcohol (PVA); a polyimide; a polycarbonate (PC); polyethylene terephthalate (PET); polystyrene; a silanol derivative (a silane coupling agent) such as N-(2-aminoethyl)-3-aminopropyltrimethoxysilane (AEAPTMS), 3-mercaptopropyltrimethoxysilane (MPTMS), and octadecyltrichlorosilane (OTS); and an organic-based insulating material (an organic polymer) such as a linear hydrocarbon having a functional group capable of binding to the control electrode at one end, such as octadecanethiol and dodecyl isocyanate, may be given; and further, combinations of these may be used. As the silicon oxide-based material, silicon oxide ($SiO_X$), BPSG, PSG, BSG, AsSG, PbSG, silicon oxynitride (SiON), and SOG (spin-on glass) may be illustrated; further, a low-permittivity material (e.g. a poly(aryl ether), a cycloperfluorocarbon polymer, benzocyclobutene, a cyclic fluorine resin, polytetrafluoroethylene, an aryl ether fluoride, a polyimide fluoride, amorphous carbon, and an organic SOG) may be used. As the method for forming the insulating layer, any of the various PVD methods described above; various CVD methods; the spin coating method; the various application methods described above; the sol-gel method; the electrodeposition method; the shadow mask method; and the spraying method may be given.

Example 1

Example 1 relates to the imaging element and the electronic device according to the first embodiment and the second embodiment of the present disclosure. A schematic partial cross-sectional view of an imaging element or an electronic device of Example 1 is shown in FIG. 1B.

The imaging element or the electronic device of Example 1 (hereinafter, referred to as "the imaging element etc. of Example 1") includes a stacked structure body composed of a first electrode 21, a light receiving layer or a light emitting/light receiving layer (a light receiving layer etc. 23) formed on the first electrode 21, and a second electrode 22 formed on the light receiving layer etc. 23. Here, the second electrode 22 is made of an amorphous oxide containing zinc and/or tungsten and having transparency and electrical conductivity. Specifically, the second electrode 22 is made of an IZO, an IWO, or an IWZO. The second electrode 22 has absorption characteristics (ultraviolet absorption characteristics) of 10% or more, preferably 11% or more, and more preferably 12% or more at a wavelength of 350 nm, and 20% or more and preferably 35% or more at a wavelength of 300 nm. The second electrode may have one or more of the absorption characteristics. Alternatively, the thickness of the second electrode 22 is $1\times10^{-8}$ m to $1.5\times10^{-7}$ m, preferably $2\times10^{-8}$ m to $1\times10^{-7}$ m, and more preferably $3\times10^{-8}$ m to $5\times10^{-8}$ m.

Here, in the imaging element etc. of Example 1, more specifically, the first electrode 21 is formed on a substrate 10 formed of a silicon semiconductor substrate, the light receiving layer etc. 23 is formed on the first electrode 21, and the second electrode 22 is formed on the light receiving layer etc. 23. That is, the electronic device of Example 1 has a two-terminal electronic device structure including the first electrode 21 and the second electrode 22. In the light receiving layer etc. 23, specifically, photoelectric conversion is performed. In the imaging element etc. of Example 1, the work function of the second electrode 22 is 4.5 eV or less, specifically 4.1 eV to 4.5 eV. The difference between the value of the work function of the second electrode 22 and the value of the work function of the first electrode 21 is 0.4 eV or more. Here, by setting the difference between the value of the work function of the second electrode 22 and the value of the work function of the first electrode 21 to 0.4 eV or more, an internal electric field can be generated in the light receiving layer etc. 23 on the basis of the difference in the value of work function, and an improvement in internal quantum efficiency can be achieved. The second electrode 22 functions as a cathode electrode (negative electrode). That is, the second electrode 22 functions as an electrode for extracting electrons. On the other hand, the first electrode 21 functions as an anode electrode (positive electrode). That is, the first electrode 21 functions as an electrode for extracting holes. The light receiving layer etc. 23 is made of an organic photoelectric conversion material, specifically for example, quinacridone with a thickness of 0.1 µm. The first electrode 21 and the second electrode 22 are patterned in a desired configuration. The first electrode 21 may not be patterned depending on the circumstances.

In the case where the second electrode 22 is formed of an indium-zinc oxide (an IZO), the second electrode 22 may be formed of a transparent conductive material further doped with gallium (Ga), i.e. an indium-doped gallium-zinc oxide (an IGZO). Alternatively, the second electrode 22 may be formed of a transparent conductive material in which an IWO or an IWZO is doped with gallium (Ga), or may be formed of a transparent conductive material in which an IZO, an IWO, or an IWZO is doped with aluminum (Al) or tin (Sn). The first electrode 21 is made of, for example, a transparent conductive material of an indium-tin oxide (ITO) with a thickness of 0.1 μm. Here, the work function of the IZO, the IGZO, the IWO, or the IWZO is 4.1 eV to 4.3 eV, depending on the film formation conditions. The work function of the ITO is 4.8 eV to 5.0 eV, depending on the film formation conditions. As the material that forms the first electrode 21, other than the above, a transparent conductive material such as an indium-zinc oxide (an IZO) or tin oxide ($SnO_2$) formed under different film formation conditions from the second electrode 22 may be given.

In the imaging element etc. of Example 1, the light transmittance of the second electrode 22 for light of wavelengths of 400 nm to 660 nm is 65% or more, and also the light transmittance of the first electrode 21 for light of wavelengths of 400 nm to 660 nm is 65% or more. The light transmittance of the second electrode 22 or the first electrode 21 can be measured by forming a film of the second electrode 22 or the first electrode 21 on a transparent glass plate. The electric resistance value of the second electrode 22 is $1 \times 10^{-6}$ Ω·cm or less, and the sheet resistance value of the second electrode 22 is $3 \times 10 \Omega/\square$ to $1 \times 10^3 \Omega/\square$. The surface roughness Ra of the second electrode 22 is 1.5 nm or less, and the surface roughness Rq of the second electrode 22 is 2.5 nm or less.

A method for manufacturing the imaging element etc. of Example 1 will now be described with reference to FIG. 1A and FIG. 1B.

<Process-100>

A substrate 10 formed of a silicon semiconductor substrate is prepared. Here, in the substrate 10, for example, a driving circuit, a light receiving layer, etc. (these not illustrated) of the imaging element or the electronic device and an interconnection 11 are provided, and an insulating layer 12 is formed on the surface. In the insulating layer 12, an opening 13 at the bottom of which the interconnection 11 is exposed is provided. On the insulating layer 12 including the interior of the opening 13, a first electrode 21 made of an ITO is formed (as a film) based on the sputtering method (see FIG. 1A).

<Process-110>

Subsequently, the patterning of the first electrode 21 is performed, then a light receiving layer etc. 23 made of quinacridone is formed (as a film) on the entire surface by the vacuum deposition method, further a second electrode 22 made of an IZO, an IWO, or an IWZO is formed (as a film) on the light receiving layer etc. 23 based on the sputtering method at room temperature (specifically, 22° C. to 28° C.), and then the second electrode 22 is patterned based on photolithography technology and etching technology; thereby, a second electrode 22 patterned in a desired configuration can be obtained. Thus, the electronic device of Example 1 having the structure shown in FIG. 1B can be obtained. A parallel plate sputtering apparatus or a DC magnetron sputtering apparatus is used as the sputtering apparatus, argon (Ar) gas is used as the process gas, and an InZnO sintered body or an InWO sintered body is used as the target. Although in the photolithography technology ultraviolet light is used for the patterning of the resist material for etching, the ultraviolet light is absorbed in the second electrode 22, and the arrival of ultraviolet light at the light receiving layer etc. 23 can be suppressed. A passivation film or the like is further formed as a film on the entire surface as necessary, and patterning is performed as necessary. Although also in these processes ultraviolet light is often used, the ultraviolet light is absorbed in the second electrode 22 and is less likely to reach the light receiving layer etc. 23. On-chip microlenses are formed as necessary; also the ultraviolet light used at this time is absorbed in the second electrode 22 and is less likely to reach the light receiving layer etc. 23.

The film thickness of the second electrode 22 is set to 50 nm. The relationships between the wavelength of incident light, and the absorption characteristic (a), the light transmittance (T), and the light reflectance (R) when the second electrode 22 is formed of an IZO (assuming that the total amount of indium atoms and zinc atoms is 100 atomic %, the ratio of zinc atoms is 10 atomic %) and the relationships between the wavelength of incident light, and the absorption characteristic (a), the light transmittance (T), and the light reflectance (R) when the second electrode 22 is formed of an IWO (assuming that the total amount of indium atoms and tungsten atoms is 100 atomic %, the ratio of tungsten atoms is 10 atomic %) are shown in FIG. 2 and Table 1. As Comparative Example 1, the relationships between the wavelength of incident light, and the absorption characteristic (a), the light transmittance (T), and the light reflectance (R) when the second electrode 22 is formed of an ITO are shown in FIG. 2 and Table 1. The "wavelength" in Table 1 is the wavelength of the light that passes through the second electrode 22. The absorption characteristic (a; unit: %) of the second electrode 22 is expressed by Formula (1) below. "T" represents the light transmittance (unit: %) of the second electrode 22, and "R" represents the light reflectance (unit: %) of the second electrode 22. The value of the light transmittance "T" becomes higher as the thickness of the second electrode 22 becomes larger. On the other hand, the value of the light reflectance "R" is a value depending on the refractive index of the material that forms the second electrode 22 and the refractive index of the medium that covers the second electrode 22, and has little dependence on the thickness of the second electrode 22. Therefore, as the thickness of the second electrode 22 becomes larger, the value of a becomes lower. In FIG. 2, "T-1" represents the light transmittance when the second electrode 22 is formed of an IZO, "T-2" the light transmittance when the second electrode 22 is formed of an IWO, "T-3" the light transmittance when the second electrode 22 is formed of an ITO, "R-1" the light reflectance when the second electrode 22 is formed of the IZO, "R-2" the light reflectance when the second electrode 22 is formed of the IWO, "R-3" the light reflectance when the second electrode 22 is formed of the ITO, "α-1" the absorption characteristic when the second electrode 22 is formed of the IZO, "α-2" the absorption characteristic when the second electrode 22 is formed of the IWO, and "α-3" the absorption characteristic when the second electrode 22 is formed of the ITO.

$$\alpha = 100 - (T+R)(\%) \qquad (1)$$

TABLE 1

| | absorption characteristic α (%) | | |
|---|---|---|---|
| wavelength | 300 nm | 350 nm | 400 nm |
| IZO | 47% | 18% | 3.7% |
| IWO | 48% | 11% | 5.7% |
| ITO | 13% | 2.4% | 1.5% |

It can be seen from FIG. 2 and Table 1 that, by forming the second electrode 22 out of an amorphous oxide containing zinc (Zn) and/or tungsten (W), the second electrode 22 exhibits a high absorption characteristic in the ultraviolet region such as 350 nm and 300 nm. Here, the absorption characteristic (α) of the second electrode 22 can be controlled by controlling the amount of introduced oxygen gas (the partial pressure of oxygen gas) at the time of forming the second electrode 22 based on the sputtering method. The partial pressure of oxygen gas is preferably set to 0.005 (0.5%) to 0.01 (1%). The result of finding the relationship between the partial pressure of oxygen gas and the absorption characteristic at a wavelength of 300 nm ($α_{300}$) when the film thickness of the second electrode 22 is set to 50 nm and the second electrode 22 is formed of the IZO mentioned above is shown in Table 2 below. Thus, in the electronic device of Example 1, the absorption characteristic (α) of the second electrode 22 is controlled by controlling the amount of introduced oxygen gas (the partial pressure of oxygen gas) at the time of forming the second electrode 22 based on the sputtering method. In the second electrode 22, the ratio of oxygen content is smaller than the ratio of oxygen content of a stoichiometric composition.

TABLE 2

| the partial pressure of oxygen gas | $α_{300}$ |
|---|---|
| 0.5% | 47% |
| 2.0% | 25% |

For an imaging element etc. of Example 1A including a second electrode 22 made of an IZO and an imaging element etc. of Comparative Example 1 including a second electrode 22 made of an ITO, the result of finding the dark current and the deviation $σ[=\{(x-x_{ave})/x_{ave}\}×100$, provided that "x" represents the measured value of dark current in each imaging element, and "$x_{ave}$" represents the average value of the measured values of dark current] that indicates the variation in dark current is shown in FIG. 3. In FIG. 3, a group of data indicated by "IZO" are the data of the imaging element etc. of Example 1A, and a group of data indicated by "ITO" are the data of the imaging element etc. of Comparative Example 1. From FIG. 3, it can be seen that the value of dark current is small in the imaging element etc. of Example 1A, and the value of dark current is large in the imaging element etc. of Comparative Example 1. That is, it can be seen that, in the imaging element etc. of Example 1A, the deviation σ of dark current is within 6σ, and furthermore almost the same value of dark current has been obtained in all of the imaging elements etc. in the same substrate. On the other hand, in the imaging element etc. of Comparative Example 1, in view of the tendency that there are imaging elements etc. with large dark currents and imaging elements etc. with small dark currents, it can be said that, in the case of Comparative Example 1, imaging elements etc. with large dark currents and imaging elements etc. with small dark currents exist in the same substrate, and there is in-plane unevenness, as compared to Example 1A. In addition, the dark current in Comparative Example 1 increases by 50% while the dark current in Example 1A is stable under condition that respective imaging elements etc. of Example 1A and Comparative Example 1 are put into the environment of high-temperature and high-humidity of 85° C. and 85% relative humidity (RH) for 500 hours with reverse bias voltage of 2.6 volts assuming that the initial dark current value was 100%.

For the imaging element etc. of Example 1A and the imaging element etc. of Comparative Example 1, the measurement results of surface roughnesses Ra and Rq and the measurement result of the light transmittance of the second electrode 22 are shown in Table 3. The electric resistance value of the second electrode 22 made of an IZO with a thickness of 0.05 μm in Example 1A was $1×10^{-6}$ Ω·cm, and the sheet resistance value thereof was 20Ω/□. Further, the value of the internal quantum efficiency and the value of the ON/OFF ratio of the imaging element etc. of Example 1A and the imaging element etc. of Comparative Example 1 were as shown in Table 4 below. The internal quantum efficiency η is the ratio of the number of generated electrons to the number of incident photons, and can be expressed by the following formula.

$$η=\{(h·c)/(q·λ)\}(I/P)=(1.24/λ)(I/P)$$

where h: the Planck constant; c: the speed of light; q: the charge of an electron; λ: the wavelength of incident light (μm); I: light current, which is, in the measurement of Example 1A and Comparative Example 1, the current value (amperes/cm²) obtained by a reverse bias voltage of 1 volt; and P: the power of incident light (amperes/cm²).

TABLE 3

|  | Example 1A | Comparative Example 1 |
|---|---|---|
| Ra | 0.45 nm | 2.5 nm |
| Rq | 0.56 nm | 3.6 nm |

TABLE 4

|  | Internal quantum efficiency (%) | ON/OFF ratio |
|---|---|---|
| Example 1A | 72 | 3.8 |
| Comparative Example 1 | 45 | 1.6 |

In the electronic device of Comparative Example 1, since both of the second electrode and the first electrode are formed of an ITO, there is no difference between the value of the work function of the first electrode and the value of the work function of the second electrode as shown in the conceptual diagram of the energy diagram of FIG. 4B. Therefore, holes from the first electrode are likely to flow into the second electrode, and consequently the dark current is increased. Furthermore, since there is no difference between the value of the work function of the first electrode and the value of the work function of the second electrode, during the extraction of electrons and holes, a potential gradient is not present (that is, an internal electric field is not generated in the light receiving layer etc.), and smooth extraction of electrons and holes is difficult (see the conceptual diagram of FIG. 4D). On the other hand, in the electronic device of Example 1A, the second electrode is formed of an IZO and the first electrode is formed of an ITO, and the difference between the value of the work function of the first electrode and the value of the work function of the second electrode is 0.4 eV or more. A conceptual diagram of the energy diagram is shown in FIG. 4A. Therefore, the inflow of holes from the first electrode to the second electrode can be prevented, and consequently the occurrence of dark current can be suppressed. Furthermore, since the difference between the value of the work function of the first electrode and the value of the work function of the second electrode is as large as 0.4 eV or more, during the extraction of electrons and holes, a potential gradient is generated (that is, an internal electric field is generated in the light receiving layer etc.), and smooth extraction of electrons and holes can be performed by using the potential gradient (see the conceptual diagram of FIG. 4C).

Further, the obtained second electrode was subjected to an X-ray diffraction test. The results are shown in FIG. 5A and FIG. 5B. FIG. 5A is a chart showing the result of X-ray diffraction analysis of a second electrode in Comparative Example 1, and FIG. 5B is a chart showing the results of X-ray diffraction analysis of second electrodes in Example 1A. From FIG. 5B, it can be seen that the second electrodes of Example 1A are amorphous regardless of the film formation conditions. Further, from FIG. 5A, it can be seen that the second electrode of Comparative Example 1 has high crystallinity. Charts "a", "b", "c", and "d" in FIG. 5B show the difference in the film formation conditions; chart "a" is the data when the input electric power for sputtering is 200 watts, chart "b" is the data when the input electric power for sputtering is 150 watts, chart "c" is the data when the input electric power for sputtering is 100 watts, and chart "d" is the data when the input electric power for sputtering is 50 watts. Similar results were obtained also when the second electrode 22 was formed of an IWO or an IWZO.

It has been found that, in the imaging element etc. of Example 1A, the stacked structure body has an internal stress of compressive stress of 10 MPa to 50 MPa. On the other hand, it has been found that, in the imaging element and the electronic device of Comparative Example 1, the stacked structure body has a very high internal stress of compressive stress, i.e. 150 MPa to 180 MPa. In this regard, the first electrode 21, the light receiving layer etc. 23, and the second electrode 22 were formed as films in this order on a silicon wafer to form a stacked structure body, and the internal stress was measured based on a known method using a commercially available thin film stress measuring apparatus. Each sample of the stacked structure body that was formed as a film on a silicon wafer and subjected to stress measurement was immersed in acetone for 30 seconds, and then the condition of the insulating layer was observed using an optical microscope (magnification: 5 times). As a result, in Example 1A, there was no change between before and after immersion; but in Comparative Example 1, peeling was found in a part between the light receiving layer etc. and the second electrode. Thus, it has been found that, by forming the second electrode 22 out of an amorphous oxide, the occurrence of stress damage in the light receiving layer etc. can be suppressed reliably during the formation of the second electrode 22.

In FIG. 6, the results of measurement of the attenuation characteristic, i.e. what is called the afterimage characteristic, of light receiving output after a certain light source was applied to imaging elements are shown. In FIG. 6, "a", "b", and "c" are the results of Comparative Example 1A, Comparative Example 1B, and Comparative Example 1C, respectively; in these, an ITO was used for the second electrode, and Comparative Example 1A is an imaging element having an absorption characteristic of 13% at a wavelength of 300 nm ($\alpha_{300}$=13%), Comparative Example 1B is an imaging element having an absorption characteristic of 14% at a wavelength of 300 nm ($\alpha_{300}$=14%), and Comparative Example 1C is an imaging element having an absorption characteristic of 10% at a wavelength of 300 nm ($\alpha_{300}$=10%). On the other hand, in FIG. 6, "A" shows the result of an imaging element of Example 1A with $\alpha_{300}$=47%. In FIG. 6, there are parts in which the data of Example 1A, Comparative Example 1A, Comparative Example 1B, and Comparative Example 1C overlap. Assuming that the relative output of each imaging element at the time when 0.05 seconds has elapsed from the stop of the irradiation with applied light is "1", the afterimage characteristic that attenuates after the lapse of 0.05 seconds was measured; as a result, for the output from 0.11 seconds to 0.14 seconds, the relative value was 0.04 in the imaging elements of Comparative Example 1A, Comparative Example 1B, and Comparative Example 1C, whereas it was 0.02 in the imaging element of Example 1A; thus, it has been found that the afterimage characteristic of the imaging element of Example 1A has been improved twice over those of the imaging elements of Comparative Examples. This is presumed to be due to the fact that, when an IZO is used for the second electrode, the second electrode absorbs ultraviolet light and the amount of ultraviolet light reaching the photoelectric conversion layer can be reduced, and consequently the degradation of the photoelectric conversion layer due to ultraviolet light can be suppressed and the afterimage characteristic has been improved.

A similar result to the result described above was obtained also when the second electrode 22 was formed of an IWO or an IWZO instead of an IZO.

In the imaging element etc. of Example 1, since the second electrode is made of an amorphous oxide having transparency and electrical conductivity, light incident on the second electrode reaches the light receiving layer etc. reliably, and holes or electrons generated in the light receiving layer etc. are reliably sent out to the outside via the second electrode. Furthermore, the second electrode is formed of an amorphous oxide containing zinc and/or tungsten, and the second electrode absorbs ultraviolet light incident on the second electrode; consequently, the arrival of ultraviolet light at the light receiving layer etc. can be suppressed. Furthermore, since the ultraviolet absorption characteristic of the second electrode is prescribed, the arrival of ultraviolet light incident on the second electrode at the light receiving layer etc. can be suppressed still more reliably. Furthermore, since the thickness of the second electrode is prescribed, the light that has passed through the second electrode (the light except ultraviolet light) reaches the light receiving layer etc. still more reliably, and at the same time the second electrode can exhibit a function as an electrode reliably.

Example 2

Example 2 relates to the solid state imaging device of an embodiment of the present disclosure. The solid state imaging device of Example 2 includes a plurality of imaging elements (photoelectric conversion elements) each of which is the imaging element of Example 1.

A conceptual diagram of a solid state imaging device of Example 2 is shown in FIG. 7, and the configuration of the solid state imaging device of Example 2 is shown in FIG. 8. A solid state imaging device (imaging device) 100 of Example 2 is composed of a solid state imaging device 40 and known components of a lens group 101, a digital signal processor (DSP) 102, a frame memory 103, a display device 104, a recording device 105, a manipulation system 106, and a power supply system 107, which components are electrically connected by a bus line 108. The solid state imaging device 40 in Example 2 is composed of an imaging region 41 in which imaging elements 30 described in Example 1 are arranged in a two-dimensional array configuration on a semiconductor substrate (e.g. a silicon semiconductor substrate) and, as peripheral circuits of it, a vertical driving circuit 42, a column signal processing circuit 43, a horizontal driving circuit 44, an output circuit 45, a control circuit 46, etc. These circuits may be formed of known circuits, or may be formed using other circuit configurations (for example, various circuits used in a CCD imaging device or a CMOS imaging device in related art), as a matter of course.

On the basis of a vertical synchronization signal, a horizontal synchronization signal, and a master clock, the control circuit 46 generates a clock signal and a control signal serving as a basis of the operation of the vertical driving circuit 42, the column signal processing circuit 43, and the horizontal driving circuit 44. The generated clock signal and control signal are inputted to the vertical driving circuit 42, the column signal processing circuit 43, and the horizontal driving circuit 44.

The vertical driving circuit 42 is formed of, for example, a shift register, and selectively scans the imaging elements 30 in the imaging region 41 sequentially on a row basis in the vertical direction. A pixel signal based on a current (signal) generated in accordance with the amount of received light in each imaging element 30 is sent to the column signal processing circuit 43 via a vertical signal line 47.

The column signal processing circuit 43 is placed for each column of imaging elements 30, for example, and performs the signal processing of denoising and signal amplification on the signal outputted from the imaging elements 30 of one row for each imaging element, based on a signal from a black reference pixel (not illustrated, formed around the effective pixel area). On the output stage of the column signal processing circuit 43, a horizontal select switch (not illustrated) is provided to be connected to a part leading to a horizontal signal line 48.

The horizontal driving circuit 44 is formed of, for example, a shift register; and sequentially outputs horizontal scanning pulses to sequentially select each of the column signal processing circuits 43, and outputs the signal from each of the column signal processing circuits 43 to the horizontal signal line 48.

The output circuit 45 performs signal processing on the signal sequentially supplied from each of the column signal processing circuits 43 via the horizontal signal line 48, and outputs the resulting signal.

Depending on the material that forms the light receiving layer etc., the light receiving layer etc. itself can be configured to function also as a color filter; therefore, color separation can be made even without providing a color filter. However, depending on the circumstances, a known color filter that transmits a specific wavelength, such as red, green, blue, cyan, magenta, or yellow, may be provided above the light incidence side of the imaging element 30. The solid state imaging device may be configured as a front-side illumination type, or may be configured as a back-side illumination type. As necessary, a shutter for controlling the incidence of light on the imaging element 30 may be provided.

Hereinabove, embodiments of the present disclosure are described based on preferred Examples, but the present disclosure is not limited to these Examples. The structure, configuration, manufacturing conditions, manufacturing method, and used material of the imaging element, the electronic device, and the solid state imaging device described in Examples are only examples, and may be altered as appropriate. In the case where the electronic device of an embodiment of the present disclosure is made to function as a solar cell, the light receiving layer etc. may be irradiated with light in a state where a voltage is not applied between the second electrode and the first electrode. Also a light sensor and an image sensor can be formed by using the electronic device of an embodiment of the present disclosure. Furthermore, the composition of the second electrode used in the imaging element in the present disclosure can be applied to various fields in which a transparent conductivity is required. That is to say, a transparent conductive material which is made of an amorphous oxide containing zinc and/or tungsten and having transparency and electric conductivity can be used in various fields. Here, the transparent conductive material is made of at least one material selected from the group consisting of indium-zinc oxide, indium-tungsten oxide and indium-tungsten-zinc oxide. In addition, all of the inventions relevant to the second electrode in the imaging element in the present disclosure may be applied to the transparent conductive material.

Additionally, the present technology may also be configured as below.

A01 <<Imaging Element: First Embodiment>>

An imaging element including:
a stacked structure body composed of
a first electrode,
a light receiving layer formed on the first electrode, and
a second electrode formed on the light receiving layer,
wherein the second electrode is made of an amorphous oxide containing zinc and/or tungsten and having transparency and electrical conductivity and has absorption characteristics of 10% or more at a wavelength of 350 nm and 20% or more at a wavelength of 300 nm.

A02

The imaging element according to <A01>, wherein a thickness of the second electrode is $1\times10^{-8}$ m to $1.5\times10^{-7}$ m, preferably $2\times10^{-8}$ m to $1\times10^{-7}$ m, and more preferably $3\times10^{-8}$ m to $5\times10^{-8}$ m.

A03 <<Imaging Element: Second Embodiment>>

An imaging element including:
a stacked structure body composed of
a first electrode,
a light receiving layer formed on the first electrode, and
a second electrode formed on the light receiving layer,
wherein the second electrode is made of an amorphous oxide containing zinc and/or tungsten and having transparency and electrical conductivity, and
a thickness of the second electrode is $1\times10^{-8}$ m to $1.5\times10^{-7}$ m, preferably $2\times10^{-8}$ m to $1\times10^{-7}$ m, and more preferably $3\times10^{-8}$ m to $5\times10^{-8}$ m.

A04

The imaging element according to any one of <A01> to <A03>, wherein a work function of the second electrode is 4.5 eV or less.

A05

The imaging element according to <A04>, wherein a value of the work function of the second electrode is 4.1 eV to 4.5 eV.

A06

The imaging element according to <A04> or <A05>, wherein a difference between a value of the work function of the second electrode and a value of a work function of the first electrode is 0.4 eV or more.

A07

The imaging element according to <A06>, wherein, by setting the difference between the value of the work function of the second electrode and the value of the work function of the first electrode to 0.4 eV or more, an internal electric field is generated in the light receiving layer on the basis of the difference in the value of work function, and an improvement in internal quantum efficiency is achieved.

A08

The imaging element according to any one of <A01> to <A07>, wherein a surface roughness Ra of the second electrode is 1.5 nm or less, and a surface roughness Rq of the second electrode is 2.5 nm or less.

A09

The imaging element according to any one of <A01> to <A08>, wherein a light transmittance of the second electrode for light of wavelengths of 400 nm to 660 nm is 65% or more.

A10

The imaging element according to any one of <A01> to <A09>, wherein an electric resistance value of the second electrode is $1\times10^{-6}$ Ω·cm or less.

A11

The imaging element according to any one of <A01> to <A10>, wherein a sheet resistance value of the second electrode is $3\times10$Ω/□ to $1\times10^{-3}$Ω/□.

A12

The imaging element according to any one of <A01> to <A11>, wherein the stacked structure body has an internal stress of compressive stress of 10 MPa to 50 MPa.

A13

The imaging element according to any one of <A01> to <A12>, wherein the first electrode is formed of an indium-tin oxide, an indium-zinc oxide, or tin oxide.

A14

The imaging element according to any one of <A01> to <A13>, wherein an ultraviolet absorption characteristic of the second electrode is controlled by controlling the amount of introduced oxygen gas at the time of forming the second electrode based on a sputtering method.

A15

The imaging element according to any one of <A01> to <A14>, wherein, in the second electrode, a ratio of oxygen content is smaller than a ratio of oxygen content of a stoichiometric composition.

B01 <<Solid State Imaging Device: First Embodiment>>

A solid state imaging device including:
a plurality of imaging elements,
wherein each of the imaging elements includes a stacked structure body composed of
a first electrode,
a light receiving layer formed on the first electrode, and
a second electrode formed on the light receiving layer, and
the second electrode is made of an amorphous oxide containing zinc and/or tungsten and having transparency and electrical conductivity, and has absorption characteristics of 10% or more at a wavelength of 350 nm and 20% or more at a wavelength of 300 nm.

B02 <<Solid State Imaging Device: Second Embodiment>>

A solid state imaging device including:
a plurality of imaging elements,
wherein each of the imaging elements includes a stacked structure body composed of
a first electrode,
a light receiving layer formed on the first electrode, and
a second electrode formed on the light receiving layer,
the second electrode is made of an amorphous oxide containing zinc and/or tungsten and having transparency and electrical conductivity, and
a thickness of the second electrode is $1\times10^{-8}$ m to $1.5\times10^{-7}$ m, preferably $2\times10^{-8}$ m to $1\times10^{-7}$ m, and more preferably $3\times10^{-8}$ m to $5\times10^{-8}$ m.

B03

A solid state imaging device including a plurality of imaging elements each of which is the imaging element according to any one of <A01> to <A15>.

C01 <<Electronic Device: First Embodiment>>

An electronic device including:
a stacked structure body composed of
a first electrode,
a light emitting/light receiving layer formed on the first electrode, and
a second electrode formed on the light emitting/light receiving layer,
wherein the second electrode is made of an amorphous oxide containing zinc and/or tungsten and having transparency and electrical conductivity, and has absorption characteristics of 10% or more at a wavelength of 350 nm and 20% or more at a wavelength of 300 nm.

C02

The electronic device according to <C01>, wherein a thickness of the second electrode is $1\times10^{-8}$ m to $1.5\times10^{-7}$ m, preferably $2\times10^{-8}$ m to $1\times10^{-7}$ m, and more preferably $3\times10^{-8}$ m to $5\times10^{-8}$ m.

C03 <<Electronic Device: Second Embodiment>>

An electronic device including:
a stacked structure body composed of
a first electrode,
a light emitting/light receiving layer formed on the first electrode, and
a second electrode formed on the light emitting/light receiving layer,
wherein the second electrode is made of an amorphous oxide containing zinc and/or tungsten and having transparency and electrical conductivity, and
a thickness of the second electrode is $1\times10^{-8}$ m to $1.5\times10^{-7}$ m, preferably $2\times10^{-8}$ m to $1\times10^{-7}$ m, and more preferably $3\times10^{-8}$ m to $5\times10^{-8}$ m.

C04

The electronic device according to any one of <C01> to <C03>, wherein a work function of the second electrode is 4.5 eV or less.

C05

The electronic device according to <C04>, wherein a value of the work function of the second electrode is 4.1 eV to 4.5 eV.

C06

The electronic device according to <C04> or <C05>, wherein a difference between a value of the work function of the second electrode and a value of a work function of the first electrode is 0.4 eV or more.

C07

The electronic device according to <C06>, wherein, by setting the difference between the value of the work function of the second electrode and the value of the work function of the first electrode to 0.4 eV or more, an internal electric field is generated in the light receiving layer on the basis of the difference in the value of work function, and an improvement in internal quantum efficiency is achieved.

C08

The electronic device according to any one of <C01> to <C07>, wherein a surface roughness Ra of the second electrode is 1.5 nm or less, and a surface roughness Rq of the second electrode is 2.5 nm or less.

C09

The electronic device according to any one of <C01> to <C08>, wherein a light transmittance of the second electrode for light of wavelengths of 400 nm to 660 nm is 65% or more.

C10

The electronic device according to any one of <C01> to <C09>, wherein an electric resistance value of the second electrode is $1\times10^{-6}$ Ω·cm or less.

C11

The electronic device according to any one of <C01> to <C10>, wherein a sheet resistance value of the second electrode is $3\times10 \Omega/\square$ to $1\times10^{3}\Omega/\square$.

C12

The electronic device according to any one of <C01> to <C11>, wherein the stacked structure body has an internal stress of compressive stress of 10 MPa to 50 MPa.

C13

The electronic device according to any one of <C01> to <C12>, wherein the first electrode is formed of an indium-tin oxide, an indium-zinc oxide, or tin oxide.

C14

The electronic device according to any one of <C01> to <C13>, wherein an ultraviolet absorption characteristic of the second electrode is controlled by controlling the amount of introduced oxygen gas at the time of forming the second electrode based on a sputtering method.

C15

The electronic device according to any one of <C01> to <C14>, wherein, in the second electrode, a ratio of oxygen content is smaller than a ratio of oxygen content of a stoichiometric composition.

D01

An imaging device, including: a stacked structure body including: a first electrode, a light-receiving layer formed on the first electrode, and a second electrode formed on the light-receiving layer, where the second electrode includes an amorphous oxide including at least one of zinc and tungsten, and where the second electrode is transparent and electrically conductive and has absorption characteristics of 20% or more at a wavelength of 300 nm.

D02

The imaging device according to <D01>, where the second electrode has absorption characteristics of 10% or more at a wavelength of 350 nm and 20% or more at the wavelength of 300 nm.

D03

The imaging device according to any one of <D01> to <D02>, where the second electrode includes at least one of an indium-zinc oxide, an indium-tungsten oxide, an indium-tungsten-zinc oxide, and an indium-doped gallium-zinc oxide.

D04

The imaging device according to any one of <D01> to <D03>, where a thickness of the second electrode is about $3\times10^{-8}$ m to about $5\times10^{-8}$ m.

D05

The imaging device according to any one of <D01> to <D04>, where a work function of the second electrode is about 4.5 eV or less.

D06

The imaging device according to any one of <D01> to <D05>, where the work function of the second electrode is about 4.1 eV to about 4.5 eV.

D07

The imaging device according to any one of <D01> to <D06>, where a surface roughness Ra of the second electrode is about 1.5 nm or less, and a surface roughness Rq of the second electrode is about 2.5 nm or less.

D08

The imaging device according to any one of <D01> to <D07>, where a light transmittance of the second electrode for light of wavelengths of 400 nm to 660 nm is about 65% or more.

D09

The imaging device according to any one of <D01> to <D08>, where an electric resistance value of the second electrode is about $1\times10^{-6}$ Ω·cm or less.

D10

An imaging device, including: a stacked structure body including: a first electrode, a light-receiving layer formed on the first electrode, and a second electrode formed on the light-receiving layer, where the second electrode includes an amorphous oxide including at least one of zinc and tungsten, where the second electrode is transparent and electrically conductive, and where a thickness of the second electrode is about $3\times10^{-8}$ m to about $5\times10^{-8}$ m.

D11

The imaging device according to <D10>, where the second electrode has absorption characteristics of 20% or more at a wavelength of 300 nm.

D12

The imaging device according to any one of <D10> to <D11>, where the second electrode has absorption characteristics of 10% or more at a wavelength of 350 nm and 20% or more at the wavelength of 300 nm.

D13

The imaging device according to any one of <D10> to <D12>, where the second electrode includes at least one of an indium-zinc oxide, an indium-tungsten oxide, an indium-tungsten-zinc oxide, and an indium-doped gallium-zinc oxide.

D14

The imaging device according to any one of <D10> to <D13>, where a work function of the second electrode is about 4.5 eV or less.

D15

The imaging device according to any one of <D10> to <D14>, where the work function of the second electrode is about 4.1 eV to about 4.5 eV.

D16

The imaging device according to any one of <D10> to <D15>, where a surface roughness Ra of the second electrode is about 1.5 nm or less, and a surface roughness Rq of the second electrode is about 2.5 nm or less.

D17

The imaging device according to any one of <D10> to <D16>, where a light transmittance of the second electrode for light of wavelengths of 400 nm to 660 nm is about 65% or more.

D18

The imaging device according to any one of <D10> to <D17>, where an electric resistance value of the second electrode is about $1\times10^{-6}$ Ω·cm or less.

D19

An imaging device, including: a plurality of imaging elements, where each of the imaging elements includes a stacked structure body including: a first electrode, a light-receiving layer formed on the first electrode, and a second electrode formed on the light-receiving layer, where the second electrode includes an amorphous oxide including at least one of zinc and tungsten, where the second electrode is transparent and electrically conductive, and has absorption characteristics of 20% or more at a wavelength of 300 nm.

D20

The imaging device according to <D19>, where the second electrode has absorption characteristics of 10% or more at a wavelength of 350 nm and 20% or more at the wavelength of 300 nm.

D21

The imaging device according to any one of <D19> to <D20>, where the second electrode includes at least one of an indium-zinc oxide, an indium-tungsten oxide, an indium-tungsten-zinc oxide, and an indium-doped gallium-zinc oxide.

D22

The imaging device according to any one of <D19> to <D21>, where a thickness of the second electrode is about $3\times10^{-8}$ m to about $5\times10^{-8}$ m.

D23

The imaging device according to any one of <D19> to <D22>, where a work function of the second electrode is about 4.5 eV or less.

D24

An imaging device including: a plurality of imaging elements, where each of the imaging elements includes a stacked structure body including: a first electrode, a light-receiving layer formed on the first electrode, and a second electrode formed on the light-receiving layer, where the second electrode includes an amorphous oxide including at least one of zinc and tungsten, where the second electrode is transparent and electrically conductive, and where a thickness of the second electrode is about $3 \times 10^{-8}$ m to about $5 \times 10^{-8}$ m.

D25

The imaging device according to <D24>, where the second electrode has absorption characteristics of 20% or more at a wavelength of 300 nm.

D26

The imaging device according to any one of <D24> to <D25>, where the second electrode has absorption characteristics of 10% or more at a wavelength of 350 nm and 20% or more at the wavelength of 300 nm.

D27

The imaging device according to any one of <D24> to <D26>, where a thickness of the second electrode is about $3 \times 10^{-8}$ m to about $5 \times 10^{-8}$ m.

D28

The imaging device according to any one of <D24> to <D27>, where the second electrode includes at least one of an indium-zinc oxide, an indium-tungsten oxide, an indium-tungsten-zinc oxide, and an indium-doped gallium-zinc oxide.

D29

An electronic device including: a stacked structure body including a first electrode, a light-emitting/light-receiving layer formed on the first electrode, and a second electrode formed on the light-emitting/light-receiving layer, where the second electrode includes an amorphous oxide including at least one of zinc and tungsten, and where the second electrode is transparent and electrically conductive and has absorption characteristics of 20% or more at a wavelength of 300 nm.

D30

An electronic device including: a stacked structure body including a first electrode, a light-emitting/light-receiving layer formed on the first electrode, and a second electrode formed on the light-emitting/light-receiving layer, where the second electrode includes an amorphous oxide including at least one of zinc and tungsten, where the second electrode is transparent and electrically conductive, and where a thickness of the second electrode is about $3 \times 10^{-8}$ m to about $5 \times 10^{-8}$ m.

REFERENCE SIGNS LIST 10 substrate
11 interconnection
12 insulating layer
13 opening
21 first electrode
22 second electrode
23 light receiving layer or light emitting/light receiving layer (light receiving layer etc.)
30 imaging element
40 solid state imaging device
41 imaging region
42 vertical driving circuit
43 column signal processing circuit
44 horizontal driving circuit
45 output circuit
46 control circuit
47 vertical signal line
48 horizontal signal line
101 lens group
102 digital signal processor (DSP)
103 frame memory
104 display device
105 recording device
106 manipulation system
107 power supply system
108 bus line

What is claimed is:

1. An imaging device, comprising:
a stacked structure body comprising:
a first electrode;
a light-receiving layer formed on the first electrode; and
a second electrode formed on the light-receiving layer,
wherein a width of the second electrode is the same as a width of the first electrode in a cross-sectional view, wherein the light-receiving layer is wider than the first and second electrode in the cross-sectional view, wherein the second electrode comprises an amorphous oxide comprising tungsten, and wherein the second electrode is transparent and electrically conductive and has absorption characteristics of 20% or more at a wavelength of 300 nm.

2. The imaging device according to claim 1, wherein the second electrode further has absorption characteristics of 10% or more at a wavelength of 350 nm.

3. The imaging device according to claim 1, wherein the second electrode comprises at least one of an indium-tungsten oxide or an indium-tungsten-zinc oxide.

4. The imaging device according to claim 1, wherein a thickness of the second electrode is $3 \times 10^{-8}$ m to $5 \times 10^{-8}$ m.

5. The imaging device according to claim 1, wherein a work function of the second electrode is 4.5 eV or less.

6. The imaging device according to claim 5, wherein the work function of the second electrode is 4.1 eV to 4.5 eV.

7. The imaging device according to claim 1, wherein a surface roughness Ra of the second electrode is 1.5 nm or less, and a surface roughness Rq of the second electrode is 2.5 nm or less.

8. The imaging device according to claim 1, wherein a light transmittance of the second electrode for light of wavelengths of 400 nm to 660 nm is 65% or more.

9. The imaging device according to claim 1, wherein an electric resistance value of the second electrode is $1\times10^{-6}$ Ω·cm or less.

10. An imaging device, comprising:
a stacked structure body comprising:
a first electrode;
a light-receiving layer formed on the first electrode; and
a second electrode formed on the light-receiving layer, wherein a width of the second electrode is the same as a width of the first electrode in a cross-sectional view, wherein the light-receiving layer is wider than the first and second electrode in the cross-sectional view, wherein the second electrode comprises an amorphous oxide comprising tungsten, wherein the second electrode is transparent and electrically conductive and has absorption characteristics of 20% or more at a wavelength of 300 nm, and wherein a thickness of the second electrode is $3\times10^{-8}$ m to $5\times10^{-8}$ m.

11. The imaging device according to claim 10, wherein the second electrode further has absorption characteristics of 10% or more at a wavelength of 350 nm.

12. The imaging device according to claim 10, wherein the second electrode comprises at least one of an indium-tungsten oxide or an indium-tungsten-zinc oxide.

13. The imaging device according to claim 10, wherein a work function of the second electrode is 4.5 eV or less.

14. The imaging device according to claim 13, wherein the work function of the second electrode is 4.1 eV to 4.5 eV.

15. The imaging device according to claim 10, wherein a surface roughness Ra of the second electrode is 1.5 nm or less, and a surface roughness Rq of the second electrode is 2.5 nm or less.

16. The imaging device according to claim 10, wherein a light transmittance of the second electrode for light of wavelengths of 400 nm to 660 nm is 65% or more.

17. The imaging device according to claim 10, wherein an electric resistance value of the second electrode is $1\times10^{-6}$ Ω·cm or less.

18. An imaging device, comprising:
a plurality of imaging elements, wherein each of the plurality of imaging elements includes a stacked structure body comprising:
a first electrode;
a light-receiving layer formed on the first electrode; and
a second electrode formed on the light-receiving layer, wherein a width of the second electrode is the same as a width of the first electrode in a cross-sectional view, wherein the light-receiving layer is wider than the first and second electrode in the cross-sectional view, wherein the second electrode comprises an amorphous oxide comprising tungsten, and wherein the second electrode is transparent and electrically conductive, and has absorption characteristics of 20% or more at a wavelength of 300 nm.

19. The imaging device according to claim 18, wherein the second electrode further has absorption characteristics of 10% or more at a wavelength of 350 nm.

20. The imaging device according to claim 18, wherein the second electrode comprises at least one of an indium-tungsten oxide or an indium-tungsten-zinc oxide.

21. The imaging device according to claim 18, wherein a thickness of the second electrode is $3\times10^{-8}$ m to $5\times10^{-8}$ m.

22. The imaging device according to claim 18, wherein a work function of the second electrode is 4.5 eV or less.

23. An imaging device comprising:
a plurality of imaging elements, wherein each of the plurality of imaging elements includes a stacked structure body comprising:
a first electrode;
a light-receiving layer formed on the first electrode; and
a second electrode formed on the light-receiving layer, wherein a width of the second electrode is the same as a width of the first electrode in a cross-sectional view, wherein the light-receiving layer is wider than the first and second electrode in the cross-sectional view, wherein the second electrode comprises an amorphous oxide comprising tungsten, and wherein the second electrode is transparent and electrically conductive and has absorption characteristics of 20% or more at a wavelength of 300 nm, and wherein a thickness of the second electrode is $3\times10^{-8}$ m to $5\times10^{-8}$ m.

24. The imaging device according to claim 23, wherein the second electrode further has absorption characteristics of 10% or more at a wavelength of 350 nm.

25. The imaging device according to claim 23, wherein the second electrode comprises at least one of an indium-tungsten oxide or an indium-tungsten-zinc oxide.

26. An electronic device comprising:
a stacked structure body comprising:
a first electrode;
a light-emitting/light-receiving layer formed on the first electrode; and
a second electrode formed on the light-emitting/light-receiving layer, wherein a width of the second electrode is the same as a width of the first electrode in a cross-sectional view, wherein the light-receiving layer is wider than the first and second electrode in the cross-sectional view, wherein the second electrode comprises an amorphous oxide comprising tungsten, and wherein the second electrode is transparent and electrically conductive and has absorption characteristics of 20% or more at a wavelength of 300 nm.

27. An electronic device comprising:
a stacked structure body comprising:
a first electrode;
a light-emitting/light-receiving layer formed on the first electrode; and
a second electrode formed on the light-emitting/light-receiving layer, wherein a width of the second electrode is the same as a width of the first electrode in a cross-sectional view, wherein the light-receiving layer is wider than the first and second electrode in the cross-sectional view, wherein the second electrode comprises an amorphous oxide comprising tungsten, wherein the second electrode is transparent and electrically conductive and has absorption characteristics of 20% or more at a wavelength of 300 nm, and wherein a thickness of the second electrode is $3\times10^{-8}$ m to $5\times10^{-8}$ m.

* * * * *